(12) United States Patent
Beglin et al.

(10) Patent No.: US 11,546,010 B2
(45) Date of Patent: Jan. 3, 2023

(54) HYBRID HIGH-SPEED AND HIGH-PERFORMANCE SWITCH SYSTEM

(71) Applicants: Thomas Wayne Beglin, Ellicott City, MD (US); Farooq Ul Amin, Cary, NC (US)

(72) Inventors: Thomas Wayne Beglin, Ellicott City, MD (US); Farooq Ul Amin, Cary, NC (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 58 days.

(21) Appl. No.: 17/176,957

(22) Filed: Feb. 16, 2021

(65) Prior Publication Data
US 2022/0263536 A1    Aug. 18, 2022

(51) Int. Cl.
| H04B 1/44 | (2006.01) |
| H04B 1/00 | (2006.01) |
| H04B 1/401 | (2015.01) |

(52) U.S. Cl.
CPC ............. *H04B 1/44* (2013.01); *H04B 1/006* (2013.01); *H04B 1/401* (2013.01)

(58) Field of Classification Search
CPC .......... H04B 1/44; H04B 1/006; H04B 1/401; H01L 45/06; H03K 17/0416; H03K 17/06
See application file for complete search history.

(56) References Cited

U.S. PATENT DOCUMENTS

| 4,539,616 A | 9/1985 | Yuito et al. |
| 4,814,853 A | 3/1989 | Uchida |
| 5,614,440 A | 3/1997 | Bezama et al. |
| 5,814,853 A | 9/1998 | Chen |
| 5,834,329 A | 11/1998 | Kim et al. |
| 5,933,365 A | 8/1999 | Klersy et al. |
| 6,174,175 B1 | 1/2001 | Behfar et al. |

(Continued)

FOREIGN PATENT DOCUMENTS

| EP | 1162683 | 12/2001 |
| EP | 1162683 A2 | 12/2001 |

(Continued)

OTHER PUBLICATIONS

Bolton:"Mobile Device RF Front-End TAM Analysis and Forecast", CS MANTECH Conference, May 16-19, 2011, Palm Springs, CA, USA, pp. 1-4.

(Continued)

*Primary Examiner* — Nguyen T Vo
(74) *Attorney, Agent, or Firm* — Tarolli, Sundheim, Covell & Tummino LLP

(57) ABSTRACT

One example includes a switch system. The system includes a first signal port and a second signal port. The system also includes a first switching path arranged between the first and second signal ports. The first switching path includes at least one first switch and at least one of the at least one first switch being configured as a high-speed switching device. The system further includes a second switching path arranged between the first and second signal ports in parallel with the first switching path. The second switching path includes at least one second switch and at least one of the at least one second switch being configured as a high-performance switching device.

17 Claims, 3 Drawing Sheets

(56) References Cited

U.S. PATENT DOCUMENTS

| | | | |
|---|---|---|---|
| 6,248,655 | B1 | 6/2001 | Machida et al. |
| 6,448,576 | B1 | 9/2002 | Davis et al. |
| 6,802,598 | B2 | 10/2004 | Ito et al. |
| 6,828,884 | B2 | 12/2004 | Wyeth et al. |
| 6,953,999 | B2 | 10/2005 | Strandberg et al. |
| 7,094,705 | B2 | 8/2006 | Lin et al. |
| 7,105,377 | B1 | 9/2006 | Chang et al. |
| 7,192,880 | B2 | 3/2007 | Dostalik, Jr. |
| 7,485,968 | B2 | 2/2009 | Enquist et al. |
| 7,608,851 | B2 | 10/2009 | Chen et al. |
| 7,634,248 | B2 | 12/2009 | Xu et al. |
| 7,736,973 | B2 | 6/2010 | Orimoto et al. |
| 7,781,781 | B2 | 8/2010 | Adkisson et al. |
| 7,825,511 | B2 | 11/2010 | Daubenspeck et al. |
| 7,880,194 | B2 | 2/2011 | Breitwisch et al. |
| 7,893,435 | B2 | 2/2011 | Kazlas et al. |
| 8,084,319 | B2 | 12/2011 | Peng et al. |
| 8,242,024 | B2 | 8/2012 | Chen |
| 9,196,585 | B2 | 11/2015 | Katakura |
| 9,257,647 | B2 | 2/2016 | Borodulin et al. |
| 9,419,213 | B2 | 8/2016 | Raieszadeh et al. |
| 9,673,392 | B2 | 6/2017 | Borodulin |
| 9,917,104 | B1* | 3/2018 | Roizin .............. H01L 27/2463 |
| 10,186,742 | B2 | 1/2019 | Sherwin et al. |
| 10,490,374 | B2 | 11/2019 | Borodulin et al. |
| 10,700,270 | B2 | 6/2020 | Borodulin et al. |
| 10,784,862 | B1* | 9/2020 | Malladi .............. H03K 17/102 |
| 2002/0175741 | A1 | 11/2002 | Sher |
| 2003/0219987 | A1 | 11/2003 | Wang et al. |
| 2005/0145832 | A1 | 7/2005 | Meloni et al. |
| 2006/0148233 | A1 | 7/2006 | Datta et al. |
| 2006/0175686 | A1 | 8/2006 | Murata et al. |
| 2006/0223464 | A1* | 10/2006 | Frank .................. H03F 3/19 375/328 |
| 2007/0096071 | A1 | 5/2007 | Kordus, II et al. |
| 2007/0235708 | A1 | 10/2007 | Elmegreen et al. |
| 2007/0235784 | A1 | 10/2007 | Krusin-Elbaum et al. |
| 2008/0029753 | A1 | 2/2008 | Xu et al. |
| 2008/0083611 | A1 | 4/2008 | Felmetsger |
| 2008/0285335 | A1 | 11/2008 | Elmegreen et al. |
| 2008/0314618 | A1 | 12/2008 | Shimoosako et al. |
| 2009/0152655 | A1 | 6/2009 | Laming et al. |
| 2009/0230379 | A1 | 9/2009 | Klostermann et al. |
| 2009/0242250 | A1 | 10/2009 | Kohda et al. |
| 2009/0291546 | A1 | 11/2009 | Chen et al. |
| 2010/0159645 | A1 | 6/2010 | Yanagida |
| 2010/0187694 | A1 | 7/2010 | Yu et al. |
| 2010/0188892 | A1 | 7/2010 | Baks |
| 2010/0327247 | A1 | 12/2010 | Ward et al. |
| 2011/0012239 | A1 | 1/2011 | Gu et al. |
| 2011/0133284 | A1 | 6/2011 | Mitra et al. |
| 2011/0233766 | A1 | 9/2011 | Lin et al. |
| 2011/0254614 | A1* | 10/2011 | Huang .............. H03K 17/063 327/534 |
| 2012/0060915 | A1 | 3/2012 | Chan |
| 2012/0293420 | A1 | 11/2012 | Stoumbos et al. |
| 2013/0187120 | A1 | 7/2013 | Redaelli et al. |
| 2014/0004803 | A1* | 1/2014 | Soler Garrido ...... H04B 7/0802 455/73 |
| 2014/0266300 | A1 | 9/2014 | Sherwin et al. |
| 2014/0353571 | A1 | 12/2014 | Liu |
| 2020/0395937 | A1* | 12/2020 | Khlat .................. H04B 1/44 |
| 2021/0135326 | A1* | 5/2021 | Puente ................ H04B 1/44 |
| 2021/0152208 | A1* | 5/2021 | Moreschi ............. H03H 7/255 |

FOREIGN PATENT DOCUMENTS

| | | |
|---|---|---|
| JP | 2005244831 A | 9/2005 |
| JP | 2006173555 A | 6/2006 |
| WO | 2007030483 A2 | 3/2007 |
| WO | 2009001262 A1 | 12/2008 |

OTHER PUBLICATIONS

El-Hinnawy, et al.: "Low-loss Latching Microwave Switch Using Thermally Pulsed Non-volatile Chalcogenide Phase Change Materials"; Appl. Phys. Lett. 105, 013501 (2014) doi: 10.1063/1.4885388; Can be found on the internet at: http://aip.scitation.org/doi/10.1063/1.4885388.

Fahad, et al.: "Are Nanotube Architectures More Advantageous than Nanowire Architectures for Field Effect Transistors?"; Scientific Reports, Jun. 27, 2012, vol. 2, No. 475, pp. 1-7; found on the internet at: https://www.nature.com/articles/srep00475.

N.El-Hinnawy, et al. "Substrate Agnostic Monolithic Integration of the Inline Phase-Change Switch Technology" 2016.

Shim, Y. et al., "RF Switches Using Phase Change Materials." MEMS 2013. Figure 1.

Wang, et al,. "Directly heated four-terminal phase change switches", 2014 IEEE MTT-S International microwave Symposium (IMS2014), Tampa, FL, 2014, pp. 1-4.

Wen, et al., "A Phase-Change Via-Reconfigurable On-Chip Inductor", IEEE 2010, IEDM10-237 thru IEDM10-240.

Hayden, et al.: "Semiconductor Nanowire Devices"; NanoToday, Oct. 31, 2008, vol. 3, No. 5-6, pp. 12-22; found on the internet at: http://www.sciencedirect.com/science/article/pii/S1748013208700616?via%3Dihub.

Korean Office Action corresponding to Korean Patent Application No. 10-2017-7006907, dated Apr. 9, 2018, pp. 4.

Office Action for corresponding European application No. 15 757 416.1, dated Feb. 7, 2018.

Second Written Opinion for corresponding SG11201702190X, dated Sep. 28, 2018.

Written Opinion for corresponding SG11201702190X, dated Oct. 4, 2017.

Japanese Office Action corresponding to Japanese Patent Application No. 2017-5813535, dated Mar. 20, 2018.

IPOS Written Opinion for corresponding TW 112014702190X, dated Sep. 7, 2017.

Search Report for corresponding Taiwan Patent Application No. 104128154; completed May 16, 2017 and dated May 19, 2017.

TW Search Report for corresponding TW 104128154, dated Dec. 20, 2016.

International Search Report for corresponding PCT/US2022/011848, dated Apr. 8, 2022.

* cited by examiner

HYBRID HIGH-SPEED AND HIGH-PERFORMANCE SWITCH SYSTEM

GOVERNMENT INTEREST

The invention was made under Government Contract. Therefore, the US Government has rights to the invention as specified in that contract.

TECHNICAL FIELD

This disclosure relates generally to electronic systems, and specifically to a hybrid high-speed and high-performance switch system.

BACKGROUND

Multifunction sensor systems are rapidly becoming the expectation for upcoming sensor systems. Therefore, front-end electronics that are closest to the antenna are typically desired to possess low-loss, high-performance, and wide-band RF switching capability. Phase-change material (PCM) switching devices typically provide extremely low-loss performance, but at the expense of switching speed. For multifunction systems, many of the applications, such as radar or electronic attack, require fast switching speeds (e.g., on the order of tens of nano-seconds). Other types of switching devices can provide such switching speeds, but typically provide significant signal losses that can be detrimental to such applications.

SUMMARY

One example includes a switch system. The system includes a first signal port and a second signal port. The system also includes a first switching path arranged between the first and second signal ports. The first switching path includes at least one first switch and at least one of the at least one first switch being configured as a high-speed switching device. The system further includes a second switching path arranged between the first and second signal ports in parallel with the first switching path. The second switching path includes at least one second switch and at least one of the at least one second switch being configured as a high-performance switching device.

Another example includes a method for operating a switch system. The method includes providing at least one first control signal to a first switching path arranged between a first signal port and a second signal port to set the first switching path to a switching state to propagate a signal through the first switching path. The first switching path includes at least one first switch and at least one of the at least one first switch being configured as a high-speed switching device. The method also includes providing at least one second control signal to a second switching path arranged between the first and second signal ports to set the second switching path to a blocking state while the first switching path is set to the switching state. The second switching path includes at least one second switch and at least one of the at least one second switch being configured as a phase-change material (PCM) switching device. The method also includes providing the at least one second control signal to the second switching path to set the second switching path to a switching state to propagate a signal through the second switching path. The method further includes providing the at least one first control signal to the first switching path to set the first switching path to a blocking state while the second switching path is set to the switching state.

Another example includes a radio frequency (RF) transceiver comprising a switch system. The system includes a common transceiver port, a transmitter output port, and a receiver input port. The system also includes a first switching path arranged between the common transceiver port and the transmitter output port. The first switching path includes at least one first switch and at least one of the at least one first switch being configured as a first high-speed switching device. The system also includes a second switching path arranged between the common transceiver port and the transmitter output port in parallel with the first switching path. The second switching path includes at least one second switch and at least one of the at least one second switch being configured as a first high-performance switching device. The system also includes a third switching path arranged between the common transceiver port and the receiver input port. The third switching path comprising at least one third switch and at least one of the at least one third switch being configured as a second high-speed switching device. The system further includes a fourth switching path arranged between the common transceiver port and the receiver input port in parallel with the third switching path. The second switching path includes at least one fourth switch and at least one of the at least one fourth switch being configured as a second high-performance switching device.

DETAILED DESCRIPTION

This disclosure relates generally to electronic systems, and specifically to a hybrid high-speed and high-performance switch system. The switch system can implement a first switching path and a second switching path arranged in parallel between a first signal port and a second signal port. The first switching path can include at least one high-speed switching device (e.g., a complementary metal-oxide semiconductor (CMOS) switching device), and can therefore correspond to a high-speed switching path for a signal propagating between the first and second signal ports. The second switching path can include at least one high-performance switching device (e.g., a phase-change material (PCM) switching device), and can therefore correspond to a high-performance switching path for a signal propagating between the first and second signal ports. As described herein, the term "high-speed switching device" refers to an electronic switching device that is capable of high-speed switching (e.g., higher than the high-performance switching device), such as less than approximately 50 nanoseconds. As also described herein, the term "high-performance switching device" refers to an electronic switching device that exhibits very low (e.g., approaching zero) on-resistance and off-capacitance.

As an example, the high-speed switching path can include a first high-performance switching device, a high-speed switching device, and a second high-performance switching device arranged in series, with the high-speed switching device interconnecting the first and second high-performance switching devices. For example, the first and second high-performance switching devices can be held in a closed state during a switching mode of the high-speed switching path to substantially mitigate the deleterious effects of parasitic capacitance on the high-speed switching performance of the high-speed switching path. The high-performance switching path can include a high-performance switching device (e.g., a PCM switching device) that is held in an open state during the switching mode of the high-speed switching path.

For example, the switch system can be implemented in a radio frequency (RF) transceiver. For example, the transceiver can include two switch systems, each including a high-speed switching path and a high-performance switching path. For example, the first switch system can correspond to a transmitter and can be arranged between the first signal port corresponding to a common transceiver port and the second signal port corresponding to a transmitter output port. Similarly, the second switch system can correspond to a receiver and can be arranged between the first signal port corresponding to the common transceiver port and the second signal port corresponding to a receiver input port.

Figure 1:
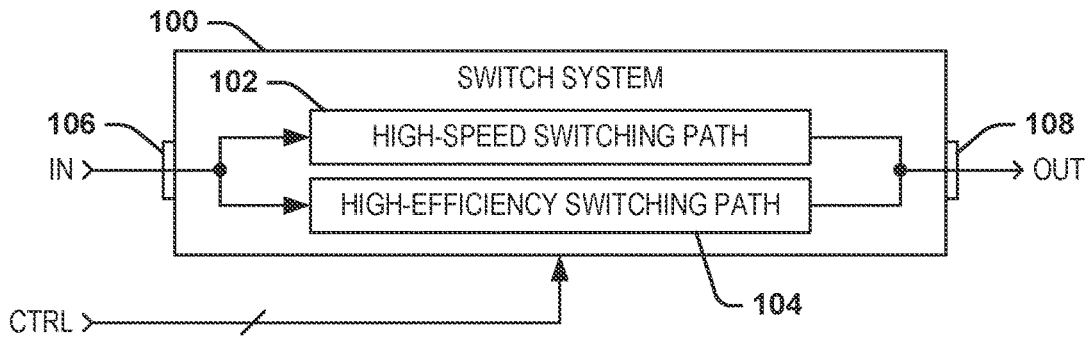
FIG. 1 illustrates an example block diagram of a switch system.

FIG. 1 illustrates an example block diagram of a switch system 100. The switch system 100 can be implemented in any of a variety of electronic systems that may require high-speed and high-performance applications. For example, the switch system 100 can be implemented in a multifunction sensor system.

The switch system 100 includes a high-speed switching path 102 and a high-performance switching path 104. The high-speed switching path 102 and the high-performance switching path 104 are arranged in parallel between a first signal port 106 and a second signal port 108. The high-speed switching path 102 can include at least one high-speed switching device (e.g., a complementary metal-oxide semiconductor (CMOS) switching device). The high-performance switching path 104 can include at least one high-performance switching device (e.g., a phase-change material (PCM) switching device). In the example of FIG. 1, the first signal port 106 receives an input signal IN and the second signal port 108 provides an output signal OUT, which can correspond to the input signal IN propagating through one of high-speed switching path 102 and the high-performance switching path 104. However, the switch system 100 can instead be configured as a bidirectional switch system.

In the example of FIG. 1, the switch system 100 is configured to receive a set of control signals CTRL. The control signals CTRL are provided to the high-speed switching path 102 and the high-performance switching path 104 to control the state of the switches in each of the high-speed switching path 102 and the high-performance switching path 104. Therefore, based on the state of the control signals CTRL, the switch system 100 can be configured to provide the input signal IN through the switch system 100 based on implementing high-speed switching or based on implementing high-performance switching. For example, the control signals CTRL can set the high-speed switching path 102 to a switching state and can set the high-performance switching path 104 to a blocking state, thereby providing high-speed switching of the input signal IN. Similarly, the control signals CTRL can set the high-performance switching path 104 to a switching state and can set the high-speed switching path 102 to a blocking state, thereby providing high-performance switching of the input signal IN.

Figure 2:
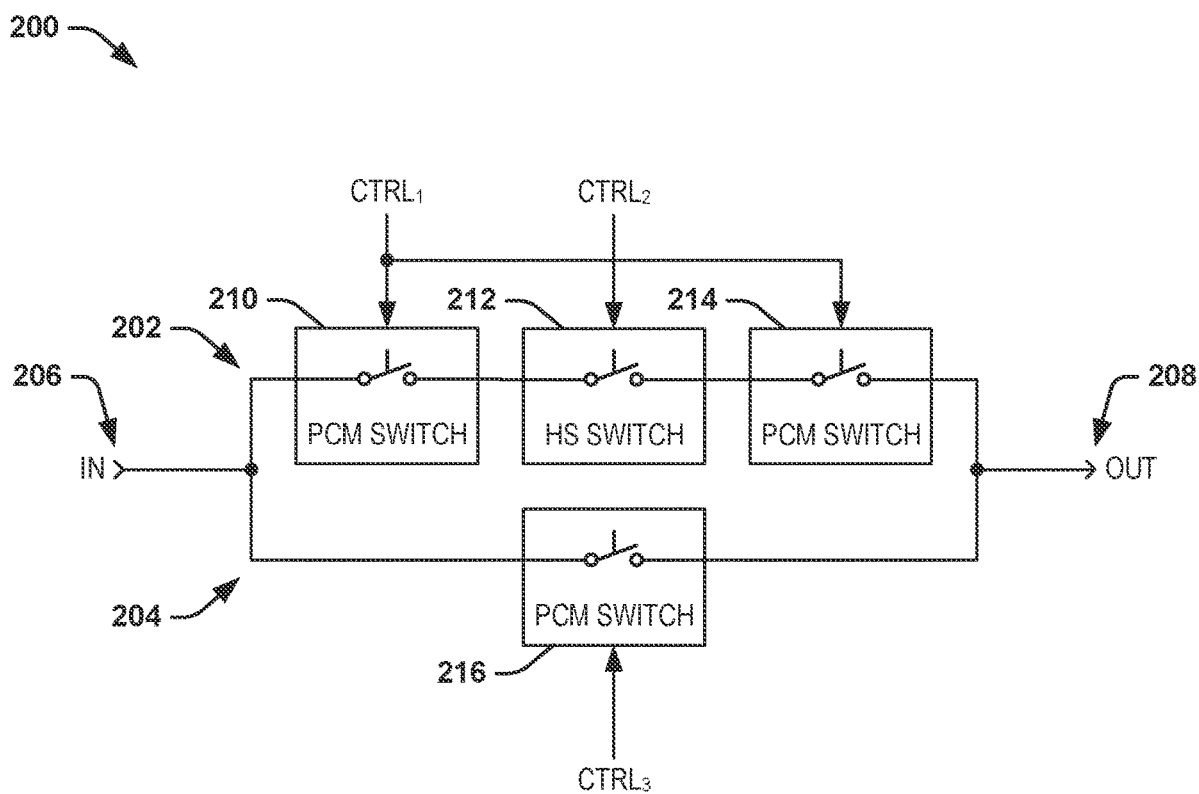
FIG. 2 illustrates an example of a switch system.

FIG. 2 illustrates an example of a switch system 200. The switch system 200 can correspond to the switch system 100 in the example of FIG. 1. Therefore, reference is to be made to the example of FIG. 1 in the following description of the example of FIG. 2.

The switch system 200 includes a high-speed switching path 202 and a high-performance switching path 204. The high-speed switching path 202 and the high-performance switching path 204 are arranged in parallel between a first signal port 206 and a second signal port 208. In the example of FIG. 2, the high-speed switching path 202 includes a first PCM switch 210, a high-speed switch 212, and a second PCM switch 214. As an example, the high-speed switch 212 can be arranged as a CMOS switching device. In the example of FIG. 2, the high-performance switching path 204 includes a third PCM switch 216. For example, the first, second, and third PCM switches 210, 214, and 216 can be monolithically integrated and can be formed from a variety of phase-change materials (e.g., GeTe, GeSbTe, etc.) and can be switched between crystalline and amorphous material states. Similar to as described above in the example of FIG. 1, the first signal port 206 receives an input signal IN and the second signal port 208 provides an output signal OUT, which can correspond to the input signal IN propagating through one of high-speed switching path 202 and the high-performance switching path 204. However, the switch system 200 can instead be configured as a bidirectional switch system.

In the example of FIG. 2, the switch system 200 is configured to receive a set of control signals CTRL. The first and second PCM switches 210 and 214 receive a first control signal $CTRL_1$, the high-speed switch 212 receives a second control signal $CTRL_2$, and the third PCM switch 216 receives a third control signal $CTRL_3$. Therefore, the control signals CTRL are provided to the high-speed switching path 202 and the high-performance switching path 204 to control the state of the first and second PCM switches 210 and 214, the high-speed switch 212, and the third PCM switch 216. Therefore, based on the state of the control signals CTRL, the switch system 200 can be configured to provide the input signal IN through the switch system 200 based on implementing high-speed switching or based on implementing high-performance switching.

As an example, the control signal $CTRL_1$ can set the first and second PCM switches 210 and 214 to an open state, the control signal $CTRL_2$ can set the high-speed switch 212 to the open state, and the control signal $CTRL_3$ can set the third PCM switch 216 to provide high-performance switching of the input signal IN through the switch system 200 via the high-performance switching path 204. As another example, the control signal $CTRL_1$ can set the first and second PCM switches 210 and 214 to a closed state, the control signal $CTRL_3$ can set the third PCM switch 216 to an open state, and the control signal $CTRL_2$ can operate the high-speed switch 212 to provide high-speed switching of the input signal IN through the switch system 200 via the high-speed switching path 202. For example, the first and second PCM switches 210 and 214, when set to the closed state by the control signal $CTRL_1$, can mitigate deleterious parasitic capacitance associated with the high-speed switch 212 during the switching state of the high-performance switching path 204. Therefore, the high-performance switching of the high-performance switching path 204 can be substantially unaffected by the parasitic capacitance of the high-speed switch 212.

Figure 3:
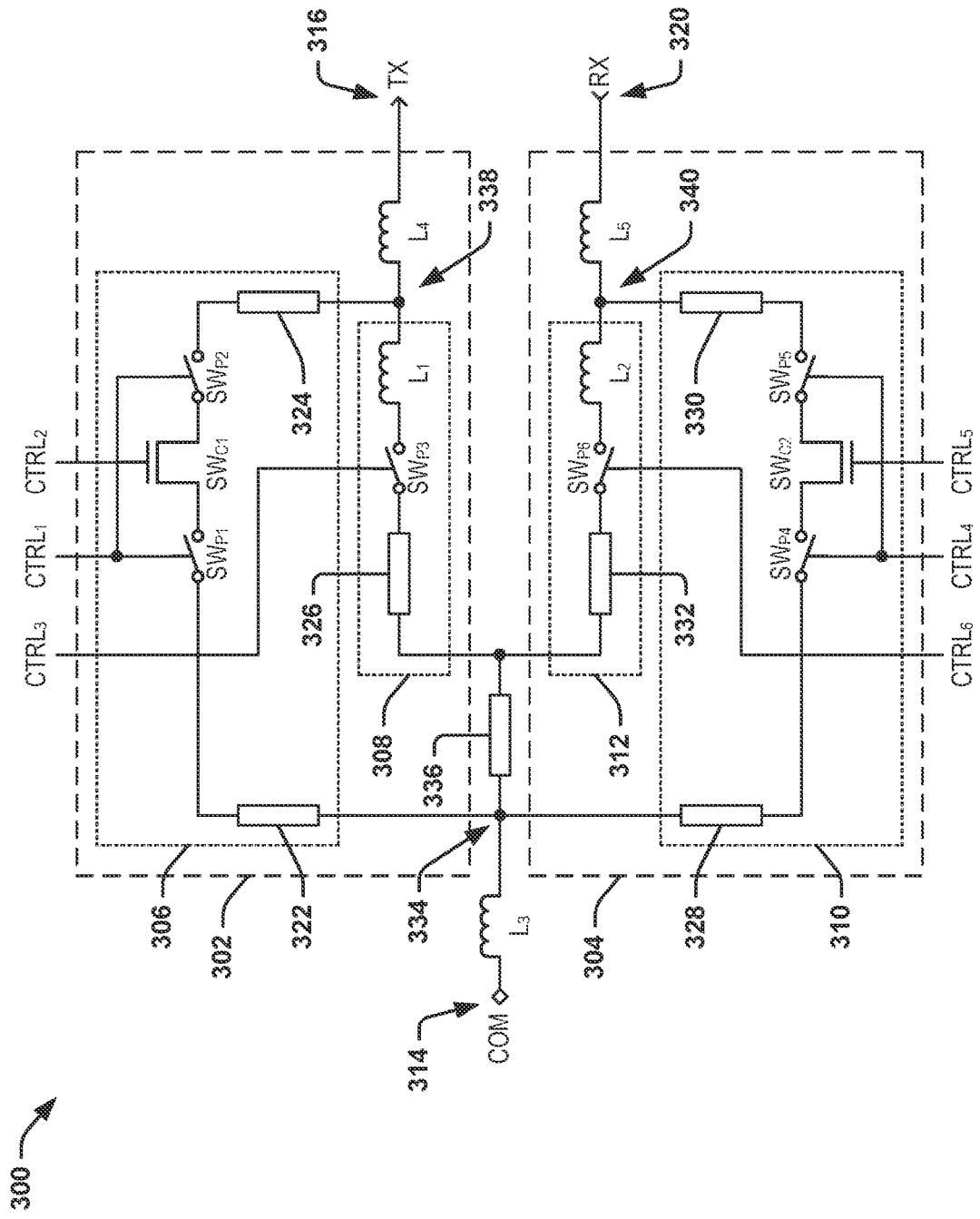
FIG. 3 illustrates another example of a switch system.

FIG. 3 illustrates another example of a switch system 300. The switch system 300 can be implemented in an RF transceiver to provide hybrid switching in each of a transmit path 302 and a receive path 304. The transmit path 302 includes a high-speed switching path 306 and a high-performance switching path 308, and the receive path 304 includes a high-speed switching path 310 and a high-performance switching path 312. Therefore, reference is to be made to the example of FIGS. 1 and 2 in the following description of the example of FIG. 3.

The high-speed switching path 306 and the high-performance switching path 308 are arranged in parallel between a common transceiver port 314 and a transmitter output port 316 that provides a transmitter output signal TX. In the example of FIG. 3, the high-speed switching path 306 includes a first PCM switch $SW_{P1}$, a high-speed switch $SW_{C1}$, and a second PCM switch $SW_{P2}$. The high-speed switch $SW_{C1}$ interconnects the switches $SW_{P1}$ and $SW_{P2}$ in series. Additionally, the high-speed switching path 306 includes a transmission line segment 322 and a transmission line segment 324 that are interconnected by the switches $SW_{P1}$, $SW_{C1}$, and $SW_{P2}$. The high-performance switching path 308 includes a third PCM switch $SW_{P3}$ that interconnects a transmission line segment 326 and an inductor $L_1$.

Similarly, the high-speed switching path 310 and the high-performance switching path 312 are arranged in parallel between a common transceiver port 314 and a receiver input port 320 that receives a received input signal RX. In the example of FIG. 3, the high-speed switching path 310 includes a fourth PCM switch $SW_{P4}$, a high-speed switch $SW_{C2}$, and a second PCM switch $SW_{P5}$, and the high-performance switching path 308 includes a third PCM switch $SW_{P6}$. The high-speed switch $SW_{C2}$ interconnects the switches $SW_{P4}$ and $SW_{P5}$ in series. Additionally, the high-speed switching path 306 includes a transmission line segment 328 and a transmission line segment 330 that are interconnected by the switches $SW_{P4}$, $SW_{C2}$, and $SW_{P5}$. The high-performance switching path 308 includes a third PCM switch $SW_{P6}$ that interconnects a transmission line segment 332 and an inductor $L_2$.

In the example of FIG. 3, the common transceiver port 314 is coupled to a node 334 through an inductor $L_3$. The node 334 is coupled to the high-speed switching path 306 and the high-speed switching path 310, and is coupled to both of the high-performance switching paths 308 and 312 through a transmission line segment 336. Additionally, an inductor $L_4$ interconnects the transmitter output port 316 and a node 338 that is coupled to the high-speed switching path 306 and the high-performance switching path 308. Similarly, an inductor $L_5$ interconnects the receiver input port 320 and a node 340 that is coupled to the high-speed switching path 310 and the high-performance switching path 312. As an example, the transmission line segments 322 and 324 in the high-speed switching path 306, the transmission line segments 328 and 330 in the high-speed switching path 310, the transmission line segments 326 and 332 in the high-performance switching paths 308 and 312, respectively, the transmission line segment 336, and the inductors $L_1$, $L_2$, $L_3$, $L_4$, and $L_5$ can provide operational benefits for the switch system 300. For example, the transmission line segments 322, 324, 326, 328, 330, 332, and 326 and the inductors $L_1$, $L_2$, $L_3$, $L_4$, and $L_5$ can provide sufficient spacing to mitigate parasitic effects in the switch system 300 (e.g., spurious magnetic fields), and can provide sufficient impedance matching of the switch system 300 (e.g., between the common transceiver port 314 and the transmitter output port 316 and between the receiver input port 320 and the common transceiver port 314).

The common transceiver port 314 therefore provides the transmitter output signal TX to the transmitter output port 316 for transmission of the transmitter output signal TX (e.g., from an antenna or transmission line), or receives the receiver input signal RX from the receiver input port 320, such as to provide the receiver input signal RX to processing electronics. In the example of FIG. 3, the switch system 300 is configured to receive a set of control signals CTRL. The first and second PCM switches $SW_{P1}$ and $SW_{P2}$ receive a first control signal $CTRL_1$, the high-speed switch $SW_{C1}$ receives a second control signal $CTRL_2$, and the third PCM switch $SW_{P3}$ receives a third control signal $CTRL_3$. Similarly, fourth and fifth PCM switches $SW_{P4}$ and $SW_{P5}$ receive a fourth control signal $CTRL_4$, the high-speed switch $SW_{C2}$ receives a fifth control signal $CTRL_5$, and the sixth PCM switch $SW_{P6}$ receives a sixth control signal $CTRL_6$.

Therefore, the control signals CTRL are provided to the high-speed switching path 306 and the high-performance switching path 308 in the transmit path 302 and to the high-speed switching path 310 and the high-performance switching path 312 in the receive path 304 to control the state of the switches therein. As a result, based on the state of the control signals CTRL, the switch system 300 can be configured to operate in a transmitter mode via the transmit path 302 or a receiver mode via the receive path 304, and can operate each of the high-speed switching path 306 and the high-performance switching path 308 in the transmit path 302 and each of the high-speed switching path 310 and the high-performance switching path 312 in the receive path 304 in high-speed switching mode or high-performance switching mode.

As an example, the control signals $CTRL_4$, $CTRL_5$, and $CTRL_6$ can set the respective switches $SW_{P4}$ and $SW_{P5}$, $SW_{C2}$, and $SW_{P6}$ to an open state to disable the receive path 304, thereby operating the switch system 300 in the transmitter mode to provide the transmitter output signal TX from the transmit output port 314. In the transmitter mode, the control signal $CTRL_1$ can set the first and second PCM switches $SW_{P1}$ and $SW_{P2}$ to an open state, the control signal $CTRL_2$ can set the high-speed switch $SW_{C1}$ to the open state, and the control signal $CTRL_3$ can set the third PCM switch $SW_{P3}$ to provide high-performance switching of the transmit output signal TX through the switch system 300 via the high-performance switching path 308. As another example, the control signal $CTRL_1$ can set the first and second PCM switches $SW_{P1}$ and $SW_{P2}$ to a closed state, the control signal $CTRL_3$ can set the third PCM switch $SW_{P3}$ to an open state, and the control signal $CTRL_2$ can operate the high-speed switch $SW_{C1}$ to provide high-speed switching of the transmit output signal TX through the switch system 300 via the high-speed switching path 306.

As another example, the control signals $CTRL_1$, $CTRL_2$, and $CTRL_3$ can set the respective switches $SW_{P1}$ and $SW_{P2}$, $SW_{C1}$, and $SW_{P3}$ to an open state to disable the transmit path 302, thereby operating the switch system 300 in the receiver mode to receive the receiver input signal RX from the receiver input port 320. In the receiver mode, the control signal $CTRL_4$ can set the fourth and fifth PCM switches $SW_{P4}$ and $SW_{P5}$ to an open state, the control signal $CTRL_5$ can set the high-speed switch $SW_{C2}$ to the open state, and the control signal $CTRL_6$ can set the sixth PCM switch $SW_{P6}$ to provide high-performance switching of the receiver input signal RX through the switch system 300 via the high-performance switching path 312. As another example, the control signal $CTRL_4$ can set the fourth and fifth PCM switches $SW_{P4}$ and $SW_{P5}$ to a closed state, the control signal $CTRL_6$ can set the sixth PCM switch $SW_{P6}$ to an open state, and the control signal $CTRL_5$ can operate the high-speed switch $SW_{C2}$ to provide high-speed switching of the receiver input signal RX through the switch system 300 via the high-speed switching path 310.

Based on the operation of the switches $SW_{C1}$, $SW_{C2}$, and $SW_{P1}$ through $SW_{P6}$, the switch system 300 can operate in a flexible manner to provide both transmit and receiver functionality, as well as in high-speed switching or high-performance switching capability. Accordingly, the switch system 300 can be implemented in any of a variety of multifunction sensor or communication systems to provide flexible transmission and receipt of RF signals.

Figure 4:
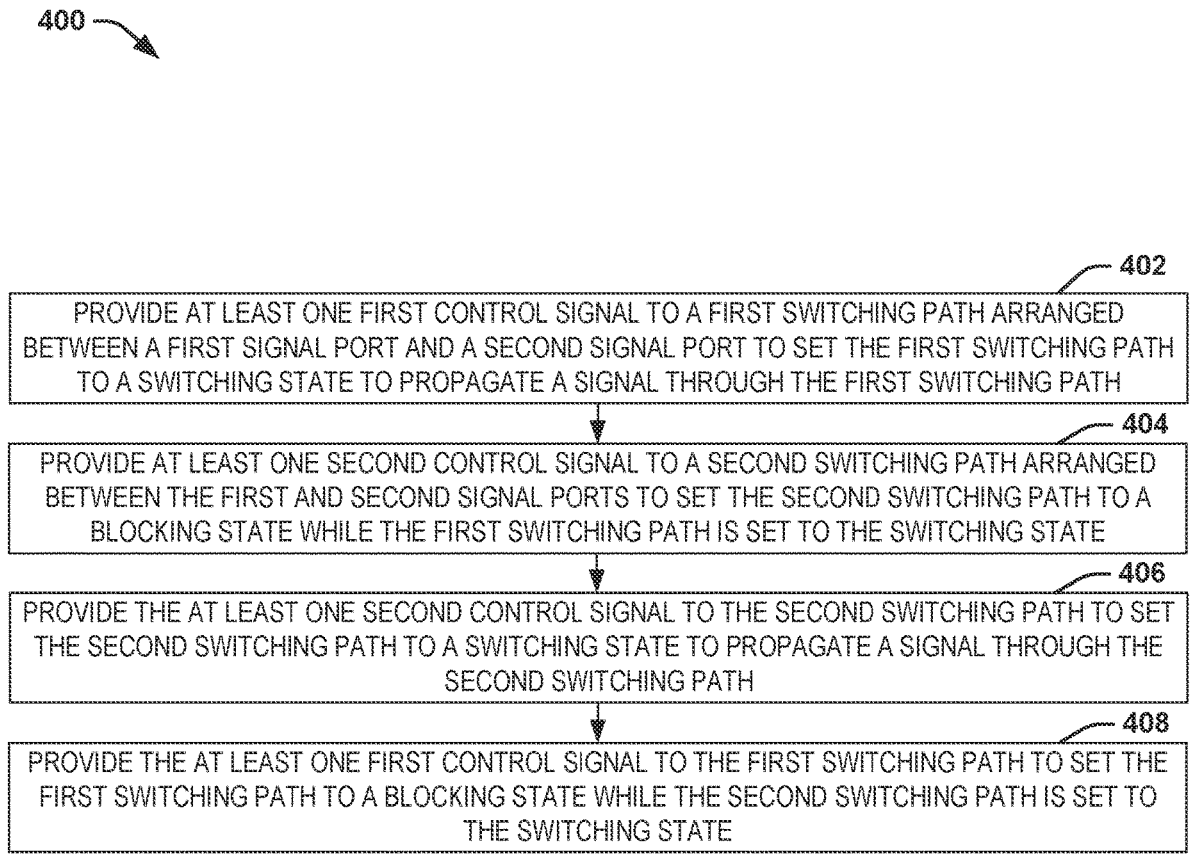
FIG. 4 illustrates an example of a method for operating a switch system.

In view of the foregoing structural and functional features described above, methods in accordance with various aspects of the present disclosure will be better appreciated with reference to FIG. 4. While, for purposes of simplicity of explanation, the method of FIG. 4 is shown and described as executing serially, it is to be understood and appreciated that the present disclosure is not limited by the illustrated orders, as some aspects could, in accordance with the present disclosure, occur in different orders and/or concurrently with other aspects from that shown and described herein. Moreover, not all illustrated features may be required to implement method in accordance with an aspect of the present disclosure.

FIG. 4 illustrates a method 400 method for operating a switch system (e.g., the switch system 100). At 402, at least one first control signal (e.g., the control signals CTRL) is provided to a first switching path (e.g., the first switching path 102) arranged between a first signal port (e.g., the first signal port 106) and a second signal port (e.g., the second signal port) to set the first switching path to a switching state to propagate a signal (e.g., the signal IN) through the first switching path. The first switching path includes at least one first switch (e.g., the switch(es) 210, 212, 214). At least one of the at least one first switch can be configured as a high-speed switching device (e.g., the high-speed switching device 212). At 404, at least one second control signal is provided to a second switching path (e.g., the second switching path 104) arranged between the first and second signal ports to set the second switching path to a blocking state while the first switching path is set to the switching state. The second switching path includes at least one second switch (e.g., the switch 216). At least one of the at least one second switch can be configured as a phase-change material (PCM) switching device (e.g., the PCM switch $SW_{P3}$). At 406, the at least one second control signal is provided to the second switching path to set the second switching path to a switching state to propagate a signal through the second switching path. At 408, the at least one first control signal is provided to the first switching path to set the first switching path to a blocking state while the second switching path is set to the switching state.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A switch system comprising:
    a first signal port;
    a second signal port;
    a first switching path arranged between the first and second signal ports, the first switching path comprising at least one first switch, at least one of the at least one first switch being configured as a high-speed switching device that has a switching time of less than 50 nanoseconds;
    a second switching path arranged between the first and second signal ports in parallel with the first switching path, the second switching path comprising at least one second switch, at least one of the at least one second switch being configured as a first high-performance switching device; and
    a second high performance switching device arranged in the first switching path in series with the high-speed switching device, second high-performance switching device being held in a closed state when the signal is provided through the first switching path and being held in an open state when the signal is provided through the second switching path,
    wherein the first and second high-performance switching devices each have an approximately zero on-resistance and an approximately zero off capacitance.

2. The system of claim 1, wherein the high-performance switching device is configured as a phase-change material (PCM) switching device.

3. The system of claim 1, wherein the high-speed switching device is configured as a complementary metal-oxide semiconductor (CMOS) switching device.

4. The system of claim 1, wherein the at least one first switch is controlled by a respective at least one first control signal and the at least one second switch is controlled by a respective at least one second control signal, wherein the at least one first and second control signals control the respective first and second switching paths to provide a signal through one of the first and second switching paths between the first and second signal ports.

5. The system of claim 1, wherein the first switching path further comprises a third high-performance switching device arranged in series with the high-speed switching device, with the high-speed switching device interconnecting the second and third high-performance switching devices.

6. The system of claim 1, wherein the first signal port is a transmitter input signal port, wherein the second signal port is a transmitter output port.

7. The system of claim 1, wherein the first signal port is receiver input port, wherein the second signal port is a receiver output signal port.

8. The system of claim 1, wherein the first signal port is a common transceiver port, wherein the second signal port is a transmitter output port, the system further comprising:
    a receiver input port;
    a third switching path arranged between the common transceiver port and the receiver input port, the third switching path comprising at least one third switch, at least one of the at least one third switch being configured as a high-speed switching device; and
    a fourth switching path arranged between the common transceiver port and the receiver input port in parallel with the third switching path, the second switching path comprising at least one fourth switch, at least one of the at least one fourth switch being configured as a high-performance switching device.

9. A radio frequency (RF) transceiver comprising the switch system of claim 1.

10. A method for operating a switch system, the method comprising:
providing at least one first control signal to a first switching path arranged between a first signal port and a second signal port to set the first switching path to a switching state to propagate a signal through the first switching path, the first switching path comprising at least one first switch, at least one of the at least one first switch being configured as a high-speed switching device that has a switching time of less than 50 nanoseconds;
providing at least one second control signal to a second switching path arranged between the first and second signal ports to set the second switching path to a blocking state while the first switching path is set to the switching state, the second switching path comprising at least one second switch, at least one of the at least one second switch being configured as a first phase-change material (PCM) switching device, a second PCM switching device being arranged in series in the first switching path with the high-speed switching device, the first and second PCM switching devices each have an approximately zero on-resistance and an approximately zero off capacitance;
providing the at least one second control signal to the second switching path to set the second switching path to a switching state to propagate a signal through the second switching path; and
providing the at least one first control signal to the first switching path to set the first switching path to a blocking state while the second switching path is set to the switching state,
wherein the second PCM switching device being held in a closed state when the signal is provided through the first switching path and being held in an open state when the signal is provided through the second switching path.

11. The method of claim 10, wherein the first switching path comprises the second PCM switching device, the high-speed switching device, and a third PCM switching device arranged in series in the first switching path, with the high-speed switching device interconnecting the second and third PCM switching devices.

12. The method of claim 10, wherein the first signal port is a common transceiver port, wherein the second signal port is a transceiver transmitter output port to provide the signal as a transmitter output signal, the method further comprising:
providing at least one third control signal to a third switching path arranged between the common transceiver port and a transceiver receiver input port to set the third switching path to a switching state to propagate a receiver input signal through the third switching path, the third switching path comprising at least one third switch, at least one of the at least one third switch being configured as a high-speed switching device;
providing at least one fourth control signal to a fourth switching path arranged between the common transceiver port and the transceiver receiver input port to set the fourth switching path to a blocking state while the third switching path is set to the switching state, the fourth switching path comprising at least one fourth switch, at least one of the at least one fourth switch being configured as a PCM switching device;
providing the at least one fourth control signal to the fourth switching path to set the fourth switching path to a switching state to propagate the receiver input signal through the fourth switching path; and
providing the at least one third control signal to the third switching path to set the third switching path to a blocking state while the fourth switching path is set to the switching state.

13. A radio frequency (RF) transceiver comprising a switch system, the switch system comprising:
a common transceiver port;
a transmitter output port;
a receiver input port;
a first switching path arranged between the common transceiver port and the transmitter output port, the first switching path comprising at least one first switch, at least one of the at least one first switch being configured as a first high-speed switching device; and
a second switching path arranged between the common transceiver port and the transmitter output port in parallel with the first switching path, the second switching path comprising at least one second switch, at least one of the at least one second switch being configured as a first high-performance switching device;
a third switching path arranged between the common transceiver port and the receiver input port, the third switching path comprising at least one third switch, at least one of the at least one third switch being configured as a second high-speed switching device;
a fourth switching path arranged between the common transceiver port and the receiver input port in parallel with the third switching path, the second switching path comprising at least one fourth switch, at least one of the at least one fourth switch being configured as a second high-performance switching device;
a third high-performance switching device arranged in series with the first high-speed switching device in the first switching path, the third high-performance switching device being held in a closed state when the transmitter output signal is provided through the first switching path and being held in an open state when the transmitter output signal is provided through the second switching path; and
a fourth high-performance switching device arranged in series with the second high-speed switching device in the third switching path, the fourth high-performance switching device being held in a closed state when the receiver input signal is provided through the third switching path and being held in an open state when the receiver input signal is provided through the fourth switching path,
wherein the first and second high-speed switching devices have a switching time of less than 50 nanoseconds, and
wherein the first, second, third, and fourth high-performance switching devices each have an approximately zero on-resistance and an approximately zero off capacitance.

14. The system of claim 13, wherein the first and second high-performance switching device are configured as phase-change material (PCM) switching devices.

15. The system of claim 13, wherein the first and second high-speed switching devices are configured as complementary metal-oxide semiconductor (CMOS) switching devices.

16. The system of claim 13, wherein the at least one first switch is controlled by a respective at least one first control signal, the at least one second switch is controlled by a respective at least one second control signal, the at least one third switch is controlled by a respective at least one third control signal, and the at least one fourth switch is controlled by a respective at least one fourth control signal, wherein the at least one first and second control signals control the respective first and second switching paths to provide a transmitter output signal through one of the first and second switching paths, wherein the at least one third and fourth control signals control the respective third and fourth switching paths to provide a receiver input signal through one of the third and fourth switching paths.

17. The system of claim 13, wherein the third switching path further comprises a fifth high-performance switching device, the second high-speed switching device, and a sixth high-performance switching device arranged in series in the third switching path, with the second high-speed switching device interconnecting the fifth and sixth high-performance switching devices.

* * * * *